United States Patent
Kehl

(10) Patent No.: US 8,471,738 B2
(45) Date of Patent: Jun. 25, 2013

(54) METHOD FOR DETECTING ERRORS OF AN A/D CONVERTER

(75) Inventor: Natalja Kehl, Obersulm (DE)

(73) Assignee: Robert Bosch GmbH, Stuttgart (DE)

( * ) Notice: Subject to any disclaimer, the term of this patent is extended or adjusted under 35 U.S.C. 154(b) by 99 days.

(21) Appl. No.: 13/116,267

(22) Filed: May 26, 2011

(65) Prior Publication Data

US 2011/0291868 A1    Dec. 1, 2011

(30) Foreign Application Priority Data

May 31, 2010    (DE) .......................... 10 2010 029 497

(51) Int. Cl.
    *H03M 1/10*    (2006.01)
(52) U.S. Cl.
    USPC .......................................... 341/120; 341/155
(58) Field of Classification Search
    USPC .......................................... 341/161, 120, 155
    See application file for complete search history.

(56) References Cited

U.S. PATENT DOCUMENTS

| | | | | | |
|---|---|---|---|---|---|
| 4,896,155 | A | * | 1/1990 | Craiglow | 341/120 |
| 4,903,023 | A | * | 2/1990 | Evans et al. | 341/120 |
| 5,047,772 | A | * | 9/1991 | Ribner | 341/156 |
| 5,926,123 | A | * | 7/1999 | Ostrom et al. | 341/120 |

OTHER PUBLICATIONS

Takashi Matsubara, Yoshiaki Koga, "A Proposal for Error-Tolerating Codes", 1993 IEEE, pp. 130-136.
Chin-long Wey, Shoba Krishnan, and Sodes Sahli, "Test Generation and Concurrent Error Detection in Current-Mode A/D Converters", 1995 IEEE, pp. 1291-1298.

* cited by examiner

*Primary Examiner* — Brian Young
(74) *Attorney, Agent, or Firm* — Kenyon & Kenyon LLP

(57) ABSTRACT

A method for detecting errors of an A/D converter which is designed for converting an analog input signal into a digital output signal. The digital output signal represents a number z which results from an input value of the analog input signal when an A/D conversion is carried out. In the method, a value range for all possible numbers z is subdivided into subranges, and a value range for all possible input values is subdivided into subranges and an input value and a number z corresponding thereto are associated in each case with subranges which correspond to one another. In the method, a check is made to determine with which subrange an input value which is to be converted is associated, and with which subrange a number which is ascertained by the A/D converter is associated. An error is detected when the number and the input value are associated with subranges which do not correspond to one another.

10 Claims, 6 Drawing Sheets

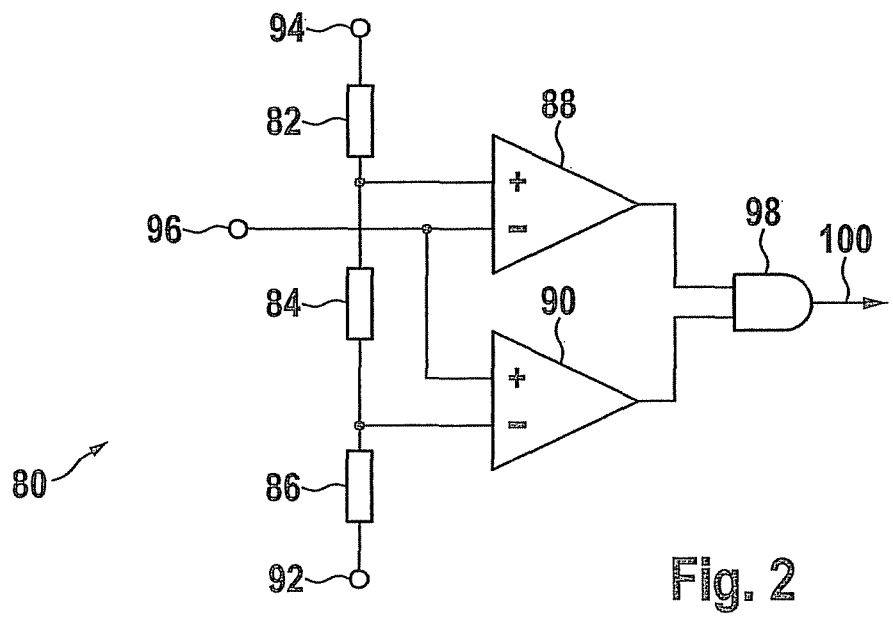
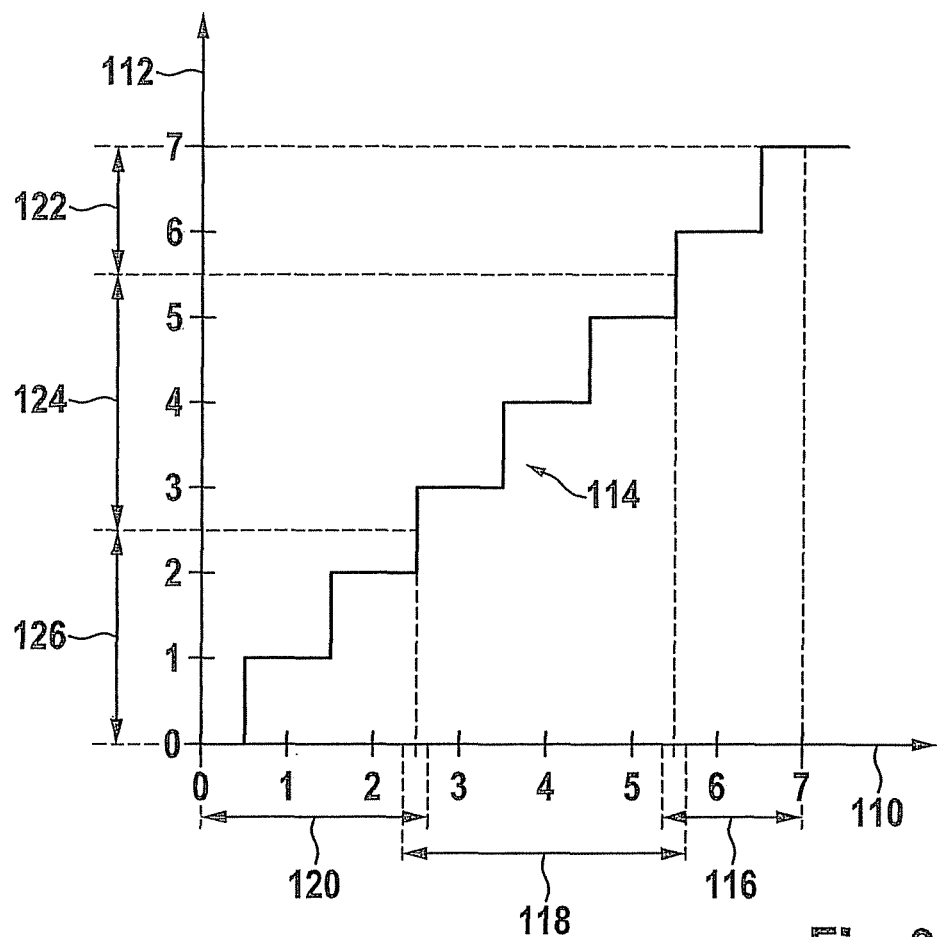
Fig. 2
Fig. 3

METHOD FOR DETECTING ERRORS OF AN A/D CONVERTER

CROSS REFERENCE

The present application claims the benefit under 35 U.S.C. §119 of German Patent Application No. 102010029497.1 filed on May 31, 2010, which is expressly incorporated herein by reference in its entirety.

FIELD OF THE INVENTION

The present invention relates to a method and a circuit system for detecting errors of an A/D converter.

BACKGROUND INFORMATION

So-called converters are used in the field of electrical engineering for converting signals. Analog/digital or A/D converters are provided for converting analog signals into digital signals. Digital signals may be converted into analog signals using digital/analog or D/A converters. Since errors may occur during conversion of signals, it is necessary to be able to detect such errors.

For ensuring the reliability of an A/D converter, the use of an alternating logic system is proposed in the publication "Test Generation and Concurrent Error Detection in Current-Mode A/D Converters," IEEE, 1995, by Wey, Chin-Long, Shoba Krishnan, and Sondes Sahli. In the cited document, first a current It1=Iin to be measured is digitized with the aid of an A/D converter and the result is stored in a register, and in the next step a second current It2=Iref−Iin is converted. The two digital values thus obtained for the currents are then compared to one another. In the error-free case, the value of second current It2 corresponds to the complementary value of first current It1. This method is based on time redundancy; i.e., the clock time of the A/D converter must be equal to or greater than twice the conversion time, so that two conversions can be carried out during a clock period. However, this requirement cannot be met for every application.

In the publication "A Proposal for Error Tolerating Codes," IEEE, 1993, by Matsubara, Takashi and Yoshiaki Koga, instead of the thermometer code the use of an error-tolerant code such as the Gray code, for example, is described for the A/D conversion. A window comparator is used for each code word bit, the individual window comparators having different voltage ranges having a large overlap. The outputs of the window comparators are able to implement an error-tolerant code in this way. However, in this method a separate window comparator is required for each code word bit. Since in this case the code word length is greater than the bit width of the digital useful signal, a relatively high hardware overhead is necessary for this method.

SUMMARY

In one example embodiment of the present invention, a circuit system for error detection for an A/D converter with the aid of at least one window comparator is provided. Among other things, an error detection circuit is described which uses only one window comparator for all bits of a digital output signal, this output signal including n output values which correspond to n bits, each output value representing one bit. In addition, a binary number z, which in turn corresponds to a decimal number, is represented by a combination of the output values, i.e., bits.

Errors which may possibly occur are detectable by the described circuit system online, i.e., during operating time of the A/D conversion. The detection of errors is typically focused on errors which may result in particularly great corruption of the output signal and of a number z to be deduced therefrom. With the aid of one embodiment of the present invention, in which a concentration is made on errors which may result in particularly great corruption of the output signal and of a number z to be deduced therefrom, the circuit system for error detection may be implemented with little complexity.

A circuit system in accordance with the present invention is able to detect various errors in a converter in which the following errors may occur:
- a serial resistor of the converter is faulty, which may result from a short circuit, an interruption, or an incorrect value;
- a comparator is faulty;
- a register, usually a memory element, is faulty; or
- a decoder logic system is faulty.

Depending on the cause of the error, one or multiple output values, and thus one or multiple bits, may be incorrect for an output signal. It is therefore meaningful to use a method for error detection which also detects multibit errors.

An association of input values $U_{in}$ with numbers z is usually defined. For an error-free A/D conversion, a given input value $U_{in}$ results in a given associated number z. A value range for all possible numbers z is subdivided into p subranges i, taking this association into account. Similarly, a value range of input values $U_{in}$ is subdivided into corresponding p subranges i.

Quantity p of subranges is less than the quantity of numbers, usually integers, z, which may be represented and/or processed as decimal or binary numbers z. Accordingly, given input value $U_{in}$ and associated given number z are associated with mutually corresponding subranges. Thus, in one example embodiment of a method according to the present invention, it is provided that a check is made to determine with which subrange i an input value $U_{in}$ to be converted is associated, and with which subrange i a number z resulting from the A/D conversion is associated, an error being detected when input value $U_{in}$ and associated number z are associated with subranges i which do not correspond to one another.

In another example embodiment, an m+1th subrange i for low-value numbers z includes exactly the same quantity, generally a smaller or larger quantity, of numbers than an mth subrange i for higher-value numbers z. Similarly, an m+1th subrange i for input values $U_{in}$ which are associated with low-value numbers z is exactly the same size, smaller, or larger than an mth subrange i for input values $U_{in}$ which are associated with higher-value numbers. The digital output signal typically includes n bits and therefore also n output values, via which $2^n$ binary numbers z are represented which correspond to decimal numbers z. Quantity p of subranges i is less than $2^n$.

The example circuit system according to the present invention is designed to carry out all steps of the example method. Individual steps of this example method may also be carried out by individual components of the circuit system. In addition, functions of the circuit system or functions of individual components of the circuit system may be carried out as steps of the example method. It is also possible for steps of the example method to be implemented as functions of at least one component of the circuit system or of the overall circuit system.

Further advantages and embodiments of the present invention result from the description and the appended drawings.

The features described above and explained below may be used not only in the particular stated combination, but also in other combinations or alone without departing from the scope of the present invention.

BRIEF DESCRIPTION OF THE DRAWINGS

FIG. 2 shows a schematic illustration of one example of a window comparator which may be used in one embodiment of a circuit system according to the present invention.

FIG. 3 shows a diagram for subdividing the value ranges of useful signals of the A/D converter from FIG. 1 into subranges.

DETAILED DESCRIPTION OF EXAMPLE EMBODIMENTS

Figure 1:
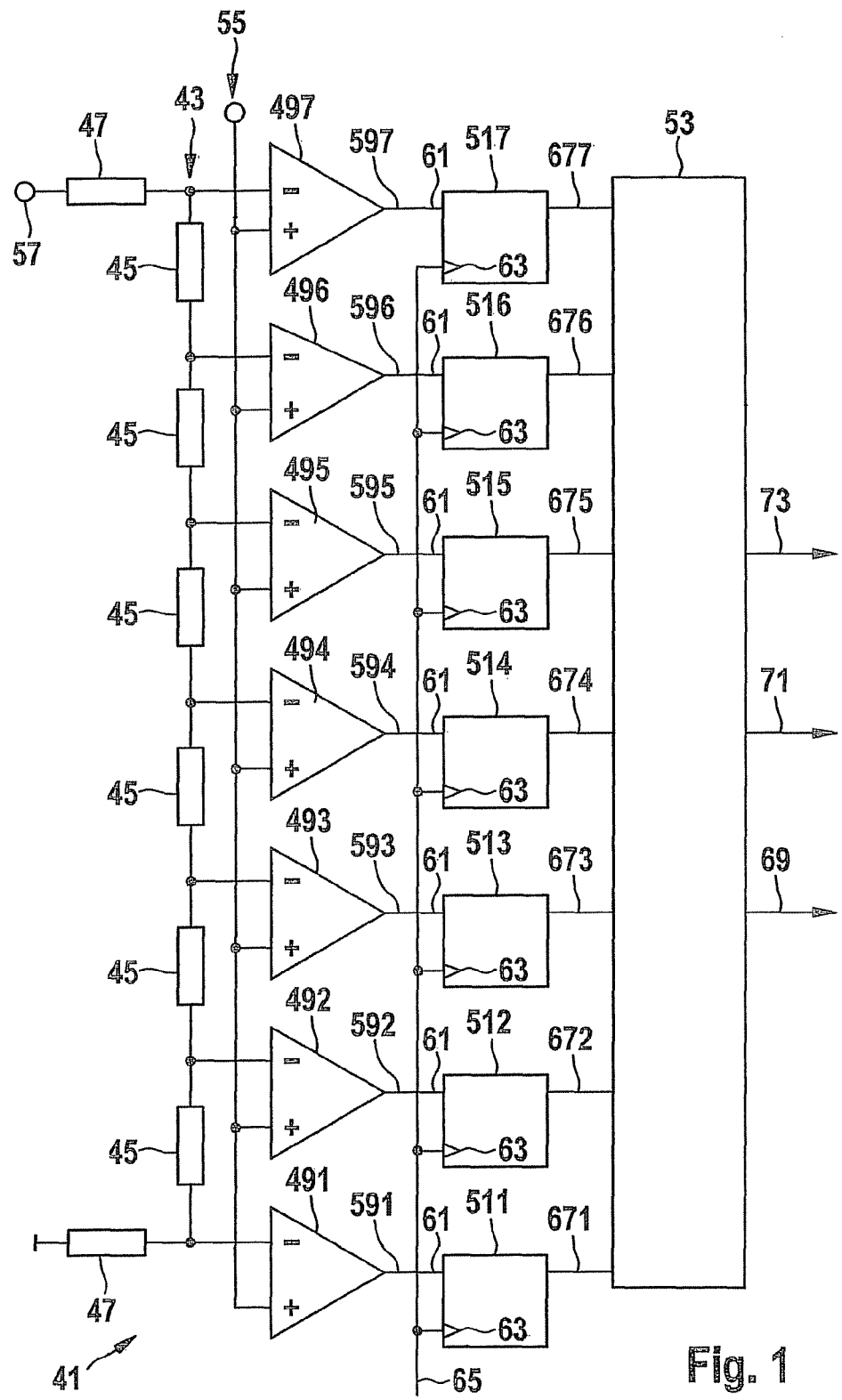
FIG. 1 shows a schematic illustration of an analog/digital converter designed as a flash A/D converter, for which a specific embodiment of an example method according to the present invention.

The present invention is schematically illustrated in the figures on the basis of specific embodiments, and is described in greater detail below with reference to the figures.

The figures are described in an interrelated and all-encompassing manner, with identical components being denoted by the same reference numerals.

FIG. 1 shows a schematic illustration of one specific embodiment of a converter designed as an A/D converter 41, having a voltage divider 43 which includes six first resistors 45, designed as series resistors, having resistance values R and connected in series, and two resistors 47, designed as input resistors, each having a resistance value R/2. Converter 41 also includes seven comparators 491, 492, 493, 494, 495, 496, 497, seven memory elements 511, 512, 513, 514, 515, 516, 517, and a decoder 53.

Using A/D converter 41 schematically illustrated in FIG. 1, an analog input signal, in the present case an input voltage 55 having an input value $U_{in}$ which is applied at positive inputs of comparators 491, 492, 493, 494, 495, 496, 497, may be digitized. A reference voltage $U_{ref}$ 57 is applied at voltage divider 43. Reference voltage 57 divided via resistors 45, 47 is applied at negative inputs of comparators 491, 492, 493, 494, 495, 496, 497.

In addition, a first comparator state k1 591 is provided at an output of a first comparator 491, a second comparator state k2 592 is provided at an output of a second comparator 492, a third comparator state k3 593 is provided at an output of a third comparator 493, a fourth comparator state k4 594 is provided at an output of a fourth comparator 494, a fifth comparator state k5 595 is provided at an output of a fifth comparator 495, a sixth comparator state k6 596 is provided at an output of a sixth comparator 496, and a seventh comparator state k7 597 is provided at an output of a seventh comparator 497.

These provided comparator states k1, k2, k3, k4, k5, k6, k7 (591, 592, 593, 594, 595, 596, 597, respectively) are supplied to first inputs 1D 61 of memory elements 511, 512, 513, 514, 515, 516, 517. Clock signal CLK 65 is supplied in each case to second inputs C1 63 of memory elements 511, 512, 513, 514, 515, 516, 517.

In addition, decoder 53 is supplied with a first T output signal x1 671 by an output Q of first memory element 511, a second T output signal x2 672 by an output Q of second memory element 512, a third T output signal x3 673 by an output Q of third memory element 513, a fourth T output signal x4 674 by an output Q of fourth memory element 514, a fifth T output signal x5 675 by an output Q of a fifth memory element 515, a sixth T output signal x6 676 by an output Q of a sixth memory element 516, and a seventh T output signal x7 677 by an output Q of a seventh memory element 517. These referenced T output signals x1, x2, x3, x4, x5, x6, x7 (671, 672, 673, 674, 675, 676, 677, respectively) form a so-called thermometer code within A/D converter 41.

n=3 digital output values and therefore n=3 bits d0, d1, d2, (69, 71, 73, respectively) are then provided by decoder 53. A zeroth output bit d0 69 stands for a value of the zeroth power of 2, a value of a first bit d1 71 stands for a value of the first power of 2, and a second bit d2 73 stands for a value of the second power of 2. Each of the three bits d0, d1, d2 (69, 71, 73, respectively) is either 0 or 1. Thus, taking a combination of the n=3 bits d0, d1, d2 (69, 71, 73, respectively) into account, with the aid of A/D converter 41 $2^n=2^3=8$ digital numbers z 000, 001, 010, 011, 100, 101, 110, which correspond to decimal numbers z 0, 1, 2, 3, 4, 5, 6, 7, may be represented.

Analog-digital converters, i.e., A/D converter 41, are always used when analog input signals are converted into digital output signals which represent numbers z. These numbers z may then be stored and further processed. Digital output signal d of width n, which includes n bits, is proportional to output value $U_{in}$ of the analog input voltage, taking sampling and quantization effects into account $$d = \frac{U_{in}}{U_{LSB}} = \frac{d_{max}}{U_{ref}} U_{in} \tag{1}$$

Where $$U_{LSB} = \frac{U_{ref}}{d_{max}} \tag{2}$$

$U_{LSB}$ represents the resolution of A/D converter 41. The example of A/D converter 41 shown in FIG. 1, having a width n=3, is structured according to the parallel conversion principle, and thus as a so-called flash A/D converter. Seven comparators 491, 492, 493, 494, 495, 496, 497 and voltage divider 43 having eight resistors 45, 47 generate the so-called thermometer code, which includes T output signals x1, x2, x3, x4, x5, x6, x7 (671, 672, 673, 674, 675, 676, 677, respectively) of memory elements 511, 512, 513, 514, 515, 516, 517, respectively. With the aid of decoder 53, the thermometer code is converted into the customary binary number z, which is represented by the n=3 bits d0, d1, d2 (69, 71, 73, respectively).

Table 1 shows the relationship between input values $U_{in}$ of analog input voltage 55, which also correspond to numbers z, comparator states k1, k2, k3, k4, k5, k6, k7 (591, 592, 593, 594, 595, 596, 597, respectively), and the digital or binary output values and therefore bits d0, d1, d2 (69, 71, 73, respectively) of the output signal, via which number z is provided or represented, for A/D converter 41 from FIG. 1. Other circuits also exist for A/D conversion.

The example method according to the present invention for error detection is explained with reference to parallel A/D converter 41 from FIG. 1 as an example, although in principle the example method may be used for all types of A/D converters. Thus, using A/D converters it is possible to convert input values $U_{in}$ into n bits d0, d1, d2 of an output signal, and thus, to $2^n$ numbers z.

TABLE 1

Relationship between input value $U_{in}$ of the input voltage, comparator states k1, k2, k3, k4, k5, k6, k7 (591, 592, 593, 594, 595, 596, 597, respectively), and output values d0, d1, d2 (69, 71, 73, respectively) for A/D converter 41 from FIG. 1.

| Input voltage | Comparator states | | | | | | | Output values, i.e., bits | | | |
|---|---|---|---|---|---|---|---|---|---|---|---|
| $Z \triangleq U_{in}$ in V | k7 | k6 | k5 | k4 | k3 | k2 | k1 | $Z \triangleq$ | d2 | d1 | d0 |
| 0 | 0 | 0 | 0 | 0 | 0 | 0 | 0 | | 0 | 0 | 0 |
| 1 | 0 | 0 | 0 | 0 | 0 | 0 | 1 | | 0 | 0 | 1 |
| 2 | 0 | 0 | 0 | 0 | 0 | 1 | 1 | | 0 | 1 | 0 |
| 3 | 0 | 0 | 0 | 0 | 1 | 1 | 1 | | 0 | 1 | 1 |
| 4 | 0 | 0 | 0 | 1 | 1 | 1 | 1 | | 1 | 0 | 0 |
| 5 | 0 | 0 | 1 | 1 | 1 | 1 | 1 | | 1 | 0 | 1 |
| 6 | 0 | 1 | 1 | 1 | 1 | 1 | 1 | | 1 | 1 | 0 |
| 7 | 1 | 1 | 1 | 1 | 1 | 1 | 1 | | 1 | 1 | 1 |

It emerges from Table 1 that each input value $U_{in}$ of the input signal corresponds to a decimal number z. Based on an input value $U_{in}$ or decimal number z to be deduced therefrom, during the A/D conversion a binary number z is provided, decimal number z and binary number z representing the same value.

The example circuit systems described below which are provided within the scope of the present invention are suitable for carrying out a range check of an analog useful signal with the aid of at least one window comparator. FIG. 2 schematically illustrates one example of such a window comparator 80.

This window comparator 80 includes three resistors 82, 84, 86 connected in series, namely, a first resistor R1 82, a second resistor R2 84, and a third resistor R3 86. Window comparator 80 also includes a first comparator 88 and a second comparator 90. The three resistors 82, 84, 86 are connected in series between ground 92 and a reference voltage 94 $U_{ref}$. In this case, an input value $U_{in}$ of an analog input voltage is present as an input signal 96 at a negative input of first comparator 88, and at a positive input of second comparator 90. In addition, a voltage which is tapped between first resistor 82 and second resistor 84 is present at a positive input of first comparator 88. A voltage which is tapped between second resistor 84 and third resistor 86 is present at a negative input of second comparator 90. Output signals of the two comparators 88, 90 are supplied to a downstream AND gate 98, and logically linked. Window comparator 80 delivers an output signal y 100 as the result to this logic AND interconnection.

The transmission range of window comparator 80 is established via resistors R1, R2, R3 (82, 84, 86, respectively) internal to the comparator. The following applies for the voltage limits of window comparator 80:

$$U_1 = \frac{R_3}{R_1 + R_2 + R_3} U_{ref} \quad (3)$$

$$U_2 = \frac{R_3 + R_2}{R_1 + R_2 + R_3} U_{ref} \quad (4)$$

The following then applies for digital output signal y 100 of window comparator 80:

$$y=1 \text{ if } U_1 < U_{in} < U_2; \text{ otherwise, } y=0 \quad (5)$$

The range between voltages $U_1$ and $U_2$ defined in formulas (3) and (4) is the so-called "window." Window comparator 80 supplies a "1" as an output signal when input value $U_{in}$ of analog input voltage 96, and thus the analog input signal, is within the window range; otherwise, a "0" is supplied.

The diagram illustrated in FIG. 3 includes an abscissa 110 along which input values $U_{in}$ of an input voltage as an analog input signal 57 (FIG. 1) are plotted in volts. Absolute decimal numbers z, which result from combinations of the digital output values, i.e., bits d0, d1, d2 (69, 71, 73, respectively), of the output signal of A/D converter 41 from FIG. 1, are indicated along an ordinate 112. A step-shaped curve 114 in the diagram illustrates an association of input values $U_{in}$ with numbers z.

Abscissa 110 is further subdivided into p=3 subranges i1, i2, i3 (116, 118, 120, respectively) for input values $U_{in}$. Input values $U_{in}$ between 5.4 volts and 7 volts are covered by a first subrange i1 116. Input values $U_{in}$ between 2.4 volts and 5.6 volts are covered by a second subrange i2 118. A third subrange i3 120 is provided for covering input values $U_{in}$ of the input voltage between 0 volts and 2.6 volts.

Ordinate 112 is likewise subdivided into p=3 subranges i1, i2, i3 (122, 124, 126, respectively) for numbers z which are formed from combinations of p=3 bits d0, d1, d2 (69, 71, 73, respectively) of the digital output signal. A first subrange i1 122 includes the decimal numbers 6 and 7, which correspond to binary numbers 110, 111; second subrange i2 124 includes decimal numbers 3, 4, and 5, which correspond to binary numbers 011, 100, 101, and third subrange i3 126 includes decimal numbers 0, 1, and 2, which correspond to binary numbers 000, 001, 010. Thus, first subrange i1 122 includes only two higher-value numbers, while second subrange i2 124 and third subrange i3 126 each include three lower-value numbers.

The dashed lines within the diagram indicate that first subranges i1 116 and 122, second subranges i2 118 and 124, and third subranges 120, 126 each correspond to one another, and therefore are mutually associated. Accordingly, in one example embodiment of the method according to the present invention the value range of input values $U_{in}$ is subdivided into p=3 subranges i1, i2, i3 (116, 118, 120, respectively) for input values $U_{in}$, and the value range of decimal numbers z is subdivided into p=3 subranges i1, i2, i3 (122, 124, 126, respectively) for numbers z; decimal numbers z result from combining and/or putting together bits d0, d1, d2, which represent corresponding number z.

In the design of one specific embodiment of a circuit system according to the present invention for detecting errors, the value range of numbers z, which are represented by bits d0, d1, d2 of output signal d of A/D converter 41, is subdivided into multiple, i.e., p=3, subranges i1, i2, i3 (122, 124, 126, respectively). Maximum input value $U_{max}$ for analog input values $U_{in}$ is 7 volts in the present case. Thus, the digital output signal is composed of a number which in the described specific embodiment includes three bits d0, d1, d2 (69, 71, 73, respectively) as digital output values. The present invention is illustrated here with reference to one numerical example which is used to explain the principle of the example circuit in a simple manner. The example method is usable for any desired value ranges for input values $U_{in}$ and $2^n$ numbers z, which may be represented by n bits.

Figure 4:
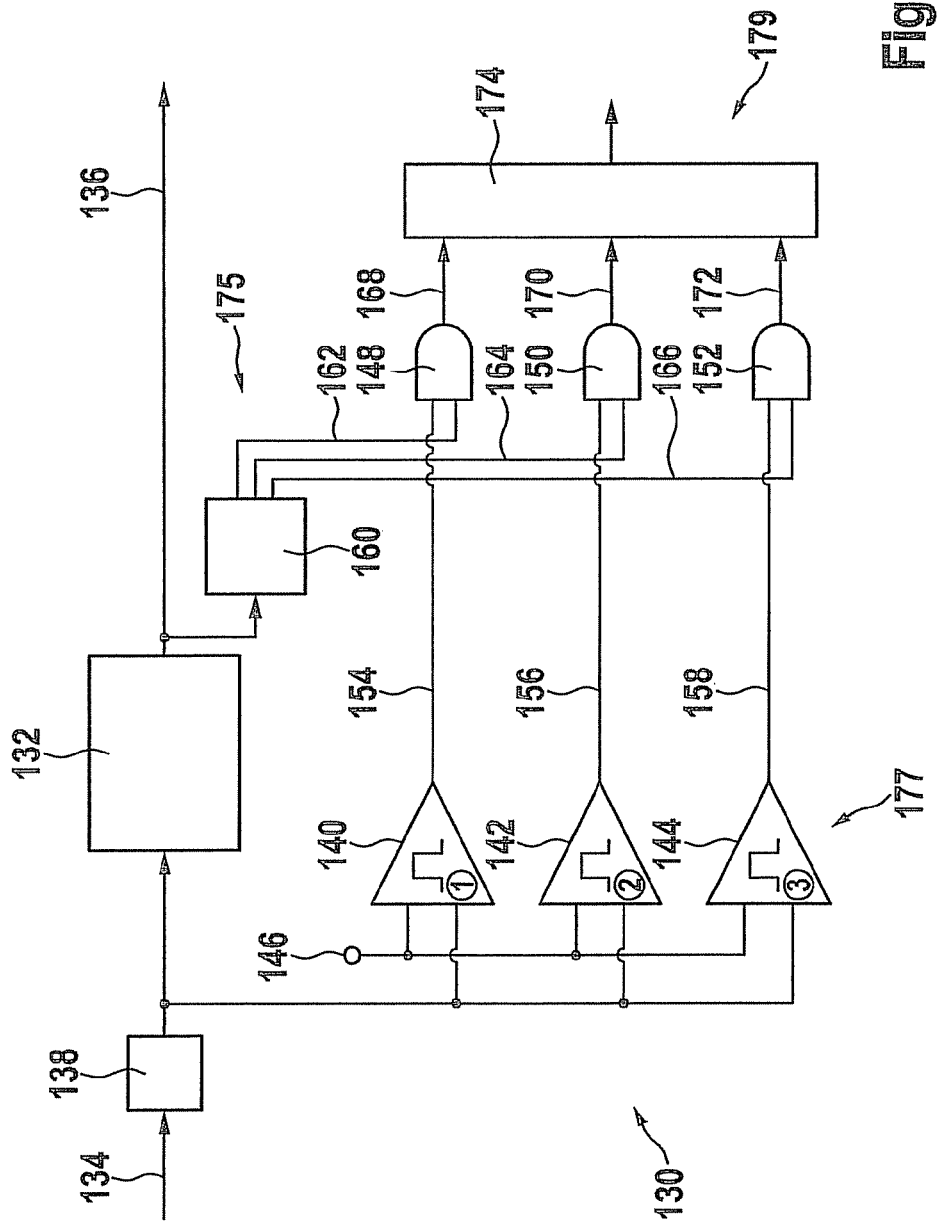
FIG. 4 shows a schematic illustration of one example embodiment of a first circuit system according to the present invention for range checking, which includes three window comparators.

FIG. 4 shows a schematic illustration of a first specific embodiment of a circuit system 130 according to the present invention, which is provided for detecting errors of a converter designed as an A/D converter 132. This A/D converter 132 is supplied with an analog input signal 134 provided for the conversion, and which in the present case corresponds to an input voltage having an input value $U_{in}$, which is converted by A/D converter 132 into a digital output signal d 136.

Circuit system 130 includes a sample-and-hold (S&H) element 138, i.e., an element for instantaneous value sampling. After passing through this S&H element 138, input signal 134 is supplied on the one hand to A/D converter 132 and on the other hand to an input of one of p=3 window comparators 140, 142, 144, one possible example of such a window comparator 80 being schematically illustrated in FIG. 2.

A reference voltage 146 $U_{ref}$ is present at each of first inputs of window comparators 140, 142, 144. An AND gate 148, 150, 152 is connected downstream from window comparator 140, 142, 144, respectively. A first comparator signal c1 154 of first window comparator 140 is supplied to a first input of first AND gate 148, a second comparator signal c2 156 of a second window comparator 142 is supplied to a first input of a second AND gate 150, and a third comparator signal c3 158 of a third window comparator 144 is supplied to a first input of a third AND gate 152.

In the specific embodiment shown here, input value $U_{in}$ of the analog input signal is associated with one of p=3 possible subranges i1, i2, i3. Thus, depending on which subrange i2, i3 input value $U_{in}$ is present in, a corresponding comparator signal c1, c2, c3 (154, 156, 158, respectively) is provided as a selection signal.

Digital output signal 136 of A/D converter 134 is supplied to a selection module 160 (selector). Via selection module 160, a first selection signal s1 162, a second selection signal s2 164, and a third selection signal s3 166 are formed from digital output signal 136. In the method, first comparator signal c1 154 and first selection signal s1 162 are linked to first AND gate 148 to form a first gate signal 168. Similarly, second comparator signal c2 156 and second selection signal s2 164 are linked to second AND gate 150 to form a second gate signal 170, and third comparator signal c3 158 and third selection signal s3 166 are linked to third AND gate 152 to form a third gate signal 172. These three formed gate signals 168, 170, 172 are checked by a selection module, which is designed as a test module 174, and an error is reported by test module 174 if an error is present in A/D converter 41.

Circuit system 130 schematically illustrated in FIG. 4 may be subdivided into a first subcircuit system 175, a second subcircuit system 177, and a test circuit system 179. First subcircuit system 175 includes selection module 160 for a subrange i1, i2, i3 of the digital output signal, a selection signal s1, s2, s3 (162, 164, 166, respectively) being associated with a subrange i1, i2, i3, respectively. Second subcircuit system 177 includes three window comparators 140, 142, 144 as components which associate input value $U_{in}$ of the analog input signal with a subrange i1, i2, i3 and form a corresponding comparator signal c1, c2, c3 (154, 156, 158, respectively). Accordingly, p=3 window comparators 140, 142, 144 form a selection module for input signal 134. Test circuit system 179 included AND gates 148, 150, 152 and test module 174 as components. Comparator signals c1, c2, c3 (154, 156, 158, respectively) and selection signals s1, s2, s3 (162, 164, 166, respectively) are compared using test circuit system 179, and a check is made to determine whether these represent subranges i1, i2, i3 which correspond to one another or do not.

A combination of the bits, i.e., digital output values, of output signal 136 represents a number z, which is usually provided in binary coded form, but which may also be represented in decimal form. This number z is associated with one of p=3 subranges with the aid of selection module 160. Depending on which subrange i1, i2, i3 number z, and thus the output signal, is to be associated with, selection module 160, and thus first subcircuit system 177, provides a corresponding selection signal s1, s2, s3 (162, 164, 166, respectively).

Described circuit system 130 for error detection checks whether analog input signal 134 and digital output signal 136 are present in mutually corresponding subranges i1, i2, i3 of a particular value range for numbers z and input values $U_{in}$. For circuit system 130 from FIG. 4, the value range of numbers z, which are provided by the output values of output signal 136 of A/D converter 132, are subdivided into p=3 subranges i1, i2, i3 (122, 124, 126, respectively) according to the diagram from FIG. 3, and which correspond to the p=3 subranges i1, i2, i3 (116, 118, 120, respectively) for the value range of input value $U_{in}$ of analog input signal 134.

At the start of each conversion period, instantaneous input value $U_{in}$ of analog useful signal 134 is initially stored by S&H element 138. In addition, selection module 160 (selector) determines subrange i1, i2, i3 in which digital output signal 136 is present at that moment. For this purpose, a combination of the bits, i.e., output values i1, i2, i3 is taken into account, and binary number z is deduced from this combination. Depending on which subrange i1, i2, i3 the combination of output values d0, d1, d2, i.e., bits, of digital output signal 136 of A/D conversion is present in, a selection signal s1, s2, s3 (162, 164, respectively) which is associated with this subrange i1, i2, i3 is transmitted to one of the three AND gates 148, 150, 152. Table 2 shows the truth table for selection module 160. Table 2 shows, among other things, that first subrange i1 includes only two higher-value numbers, namely, 110 and 111 or 6 and 7. In contrast, the two other subranges i2 and i3 for low-value numbers each include three numbers, and therefore, more numbers than first subrange i1.

TABLE 2

Truth table for the selector

| Digital output signal (output values) | | | Number | Selection signal of the selection module | | | Subrange |
|---|---|---|---|---|---|---|---|
| d2 | d1 | d0 | z | s3 | s2 | s1 | i |
| 0 | 0 | 0 | 0 | 1 | 0 | 0 | i3 |
| 0 | 0 | 1 | 1 | 1 | 0 | 0 | i3 |
| 0 | 1 | 0 | 2 | 1 | 0 | 0 | i3 |
| 0 | 1 | 1 | 3 | 0 | 1 | 0 | i2 |
| 1 | 0 | 0 | 4 | 0 | 1 | 0 | i2 |
| 1 | 0 | 1 | 5 | 0 | 1 | 0 | i2 |
| 1 | 1 | 0 | 6 | 0 | 0 | 1 | i1 |
| 1 | 1 | 1 | 7 | 0 | 0 | 1 | i1 |

Stored analog input signal 134 is delivered to the three window comparators 140 142, 144. The window ranges of these window comparators 140, 142, 144 are different, and are subdivided corresponding to subranges i1, i2, i3 from FIG. 3. Therefore, analog input signal 134 is always present in the window of window comparator 140, 142, 144, which as comparator signal c1, c2, c3 (154, 156, 158, respectively) provides a logical "1." Selection signals s1, s2, s3 (162, 164, 166, respectively) and comparator signals c1, c2, c3 (154, 156, 158, respectively) are linked via AND gates 148, 150, 152, respectively, to form gate signals.

If digital output signal 136 is in second subrange i2, for example, second selection signal s2 164=1, and if analog input signal 134 is also in second subrange i2, which is the case in the error-free state, second comparator signal c2 156=1, which results in a "1" for second gate signal b2 170. All other gate signals bi (i≠2) are then "0" in the error-free case. This relationship is checked by test module 174 (checker). Table 3 shows the truth table for test module 174. Accordingly, an error-free A/D conversion is carried out when a comparator signal c1, c2, c3 (154, 156, 158, respectively) and a selection signal s1, s2, s3 (162, 164, 166, respectively), which are associated with mutually corresponding subranges i1, i2, i3, are "1."

TABLE 3

Truth table for the test block

| Gate signal | | | Error |
|---|---|---|---|
| b2 | b1 | b0 | 1 |
| 0 | 0 | 0 | 0 |
| 0 | 0 | 1 | 0 |
| 0 | 1 | 0 | 1 |
| 0 | 1 | 1 | 0 |
| 1 | 0 | 0 | 1 |
| 1 | 0 | 1 | 1 |
| 1 | 1 | 0 | 1 |
| 1 | 1 | 1 | 1 |

Circuit system 130 from FIG. 4 detects, among other things, errors in the A/D conversion which result in particularly great corruption of the output signal. If, for example, for input signal 134 input value $U_{in}$ is to be converted into 7 V, and the most significant bit (MSB) is corrupt, the incorrect value 011=3 (see Table 3) composed of gate signals 168, 170, 172 is output for the digital output signal. In this case, second selection signal s2 164=1 and first comparator signal c1 154=1. All other comparator signals c2, c3 (156, 158, respectively) and selection signals s1, s3 (162, 166, respectively) are "0." As a result, all gate signals b1, b2, b3 (168, 170, 172, respectively) are "0." According to Table 3, test module 174 reports an error in this case. The voltage limits for subranges i1, i2, i3 of the three window comparators 140, 142, 144 are shown in the diagram from FIG. 3, and are stated in Table 4 as numerical values. These voltage limits are set via the internal resistors of individual window comparators 140, 142, 144.

TABLE 4

Voltage limits for window comparators 140, 142, 144

| Window comparator number | Subrange | Lower voltage limit | Upper voltage limit | Input value $U_{in}$ in V |
|---|---|---|---|---|
| 1 | i1 | U11 = 5.4 V | U12 = 7 V | 6.7 |
| 2 | i2 | U21 = 2.4 V | U22 = 5.6 V | 3, 4, 5 |
| 3 | i3 | U31 = 0 V | U32 = 2.6 V | 0, 1, 2 |

It is also apparent from Table 4 that the values of the voltage limits slightly overlap for subranges i1, i2, i3. This overlap is necessary in order to take into account the inaccuracy of an A/D converter to be checked. A decision concerning the size of the overlap regions is made in each case as a function of the properties of A/D converter 41, 130 which is used.

Figure 5:
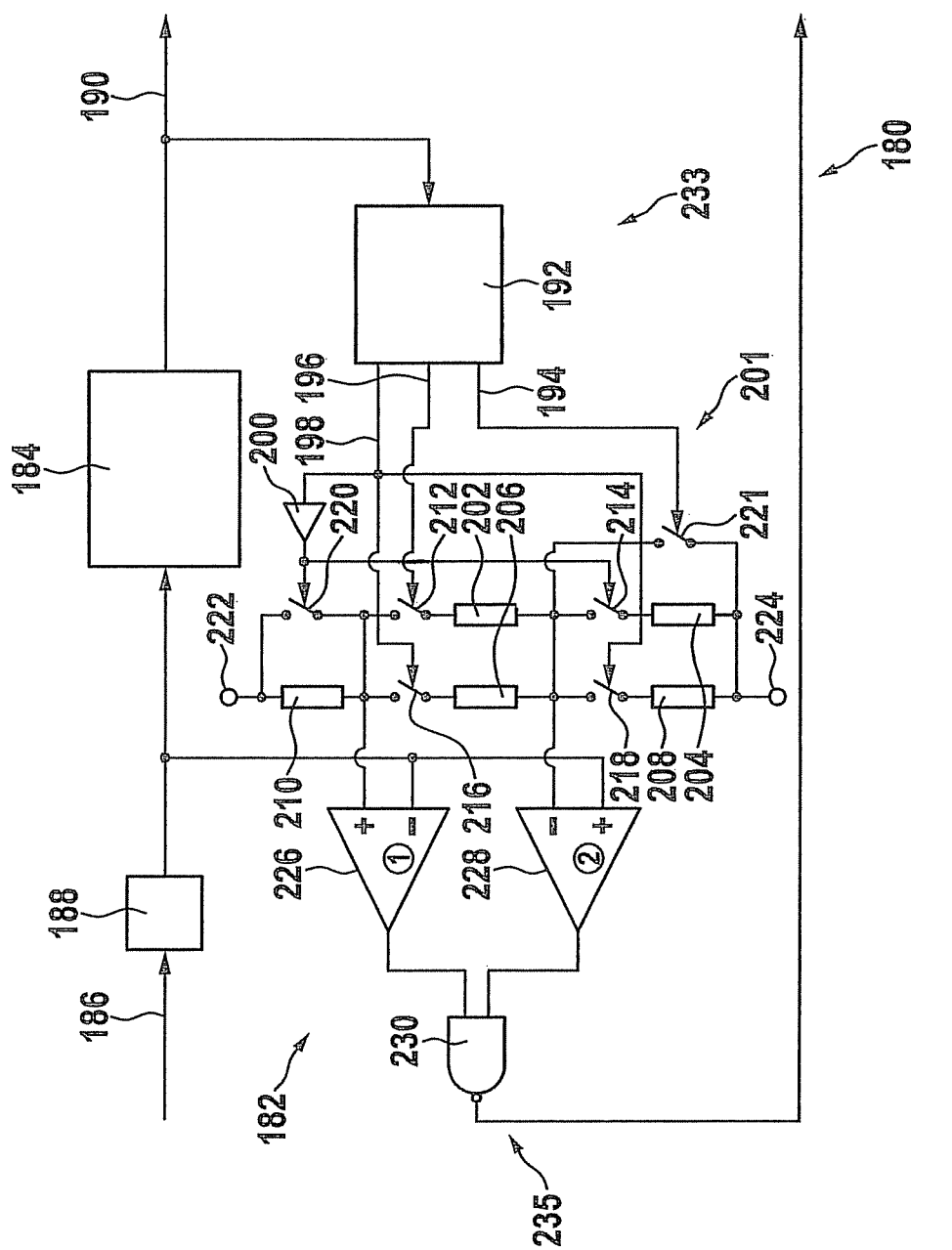
FIG. 5 shows a schematic illustration of a second example embodiment of a circuit system according to the present invention for range checking, which has only one window comparator.

FIG. 5 shows a schematic illustration of a second specific embodiment of a circuit system 180, which has only one window comparator 182 and which is designed to detect errors which may occur during operation of a converter designed as an A/D converter 184. For an A/D conversion, A/D converter 184 is supplied with an analog input signal 186 via an S&H element 188. A/D converter 184 converts analog input signal 186 into a digital output signal d 190.

For carrying out one specific example embodiment of the method according to the present invention, digital output signal 190 is supplied to a selection module which is designed as a window selection module 192 (window selector), from which, depending on the value of digital output signal 190, either a first window selection signal ws1 194, a second window selection signal ws2 196, or a third window selection signal ws3 198 is transmitted to a first resistor R1 202, a second resistor R2 204, a third resistor R3 206, a fourth resistor R4 208, or a fifth resistor R5 210 of a resistor network 201. Resistor network 201 also has an inverter 200, as well as a first switch 212, a second switch 214, a third switch 216, a fourth switch 218, a fifth switch 220, and a sixth switch 221 which are associated with resistors 202, 204, 206, 208, 210, respectively. A reference voltage 222 $U_{ref}$ is present at resistor network 201. The ground is denoted by reference numeral 224 in FIG. 5. These window selection signals ws1, ws2, ws3 (194, 196, 198, respectively) are used here as selection signals for selecting p=3 subranges i1, i2, i3. In this specific embodiment, a first subcircuit system 233 of circuit system 180 includes window selection module 192 and resistor network 201 as components.

Window comparator 182 includes a first operational amplifier 226 and a second operational amplifier 228, whose outputs are connected to inputs of a NAND gate 230. In this second specific embodiment of circuit system 180 according to the present invention, it is provided that a second subcircuit system 235 corresponds to a test circuit system. Subcircuit system 235 and the test circuit system include window comparator 182 as a shared component which is designed as a selection module.

Using the second specific example embodiment of circuit system 180 according to the present invention from FIG. 5, in one specific example embodiment of the method according to the present invention an alternative implementation of the principle of range checking is carried out. In this case, only one window comparator 182 as second subcircuit system 235, and therefore the test circuit system having the two operational amplifiers 226, 228 and a NAND gate 230 as shared components, is used. The window range, and therefore at least one of p=3 subranges i1, i2, i3 of this window comparator 182, is variably adjustable, and may be changed by switching various resistors 202, 204, 206, 208, 210 of resistor network 201 on or off by opening and closing selected switches 212, 214, 216, 218, 220, 221, respectively. The windows for the electrical voltage formed by linking resistors 202, 204, 206, 208, 210 to switches 212, 214, 216, 218, 220, 221, respectively, within resistor network 201, and therefore subranges i1, i2, i3, are switched on or off by window selection module 192 (window selector). As shown by the configuration of the lines from window selection block 192 to switches 212, 214, 216, 218, 220, 221, switch 221 is opened or closed with the aid of first window selection signal ws1 194. Switch 212 is opened or closed with the aid of second window selection signal ws2 196. Further switches 214, 216, 218, 220 are opened or closed with the aid of third window selection signal ws3 198. Window selection module 192 determines from digital output signal d 190 the window which is valid at that moment, and thus valid subrange i1, i2, i3. Table 5 shows the truth table for window selection module 192 (window selector) as selection module.

TABLE 5

Truth table for the window selector

| Bits of the digital output signal | | | Window selector/window selection signal | | | Subrange | Number |
|---|---|---|---|---|---|---|---|
| d2 | d1 | d0 | ws3 | ws2 | ws1 | i | z |
| 0 | 0 | 0 | 1 | 1 | 1 | i3 | 0 |
| 0 | 0 | 1 | 1 | 1 | 1 | i3 | 1 |
| 0 | 1 | 0 | 1 | 1 | 1 | i3 | 2 |
| 0 | 1 | 1 | 1 | 0 | 0 | i2 | 3 |
| 1 | 0 | 0 | 1 | 0 | 0 | i2 | 4 |
| 1 | 0 | 1 | 1 | 1 | 0 | i2 | 5 |
| 1 | 1 | 0 | 0 | 1 | 0 | i1 | 6 |
| 1 | 1 | 1 | 0 | 1 | 0 | i1 | 7 |

In the present case, the subdivision of the value range of D/A converter 184 into p=3 subranges i1, i2, i3 corresponds to the subdivision according to the diagram from FIG. 3, and to the values from Table 4. Likewise, the voltage limits in the diagram from FIG. 3 may be set by resistor network 201, using resistors R1, R2, R3, R4, R5 (202, 204, 206, 208, 210, respectively) of circuit system 180. This results in the following equation system:

$$U_{11} = \frac{R_1}{R_1 + R_2} U_{ref} \quad (6)$$

$$U_{22} = \frac{R_3 + R_4}{R_3 + R_4 + R_5} U_{ref} \quad (7)$$

$$U_{21} = \frac{R_4}{R_3 + R_4 + R_5} U_{ref} \quad (8)$$

$$U_{32} = \frac{R_1 \| R_3}{R_1 \| R_3 + R_5} U_{ref} \quad (9)$$

in which the following is valid:

$$R_x \| R_y = \frac{R_x \cdot R_y}{R_x + R_y}$$

If resistors R1, R2, R3, R4, R5 (202, 204, 206, 208, 210, respectively) are now selected in such a way that the equation system which includes equations (6), (7), (8), (9) is satisfied, the voltage limits in the diagram from FIG. 3 are met, and circuit system 180 for error detection in FIG. 5 detects all errors for which the input value of analog input signal 186 and number z, which is formed from a combination of output values, i.e., bits, d0, d1, d2 of digital output signal 190, are in different subranges i1, i2, i3 which do not correspond to one another.

Depending on the technology used, circuit system 180 from FIG. 5 requires less surface area than circuit system 130 from FIG. 4. Resistor network 201 in FIG. 5 is only one example; other resistor networks exist which supply appropriate voltage limits for provided subranges i1, i2, i3.

When there are particularly high demands for reliability of an electronic circuit, it is provided that errors are also detected in test module 174 (checker) in circuit system 130 from FIG. 4, in which case test module 174 should have a self-testing design.

Figure 6:
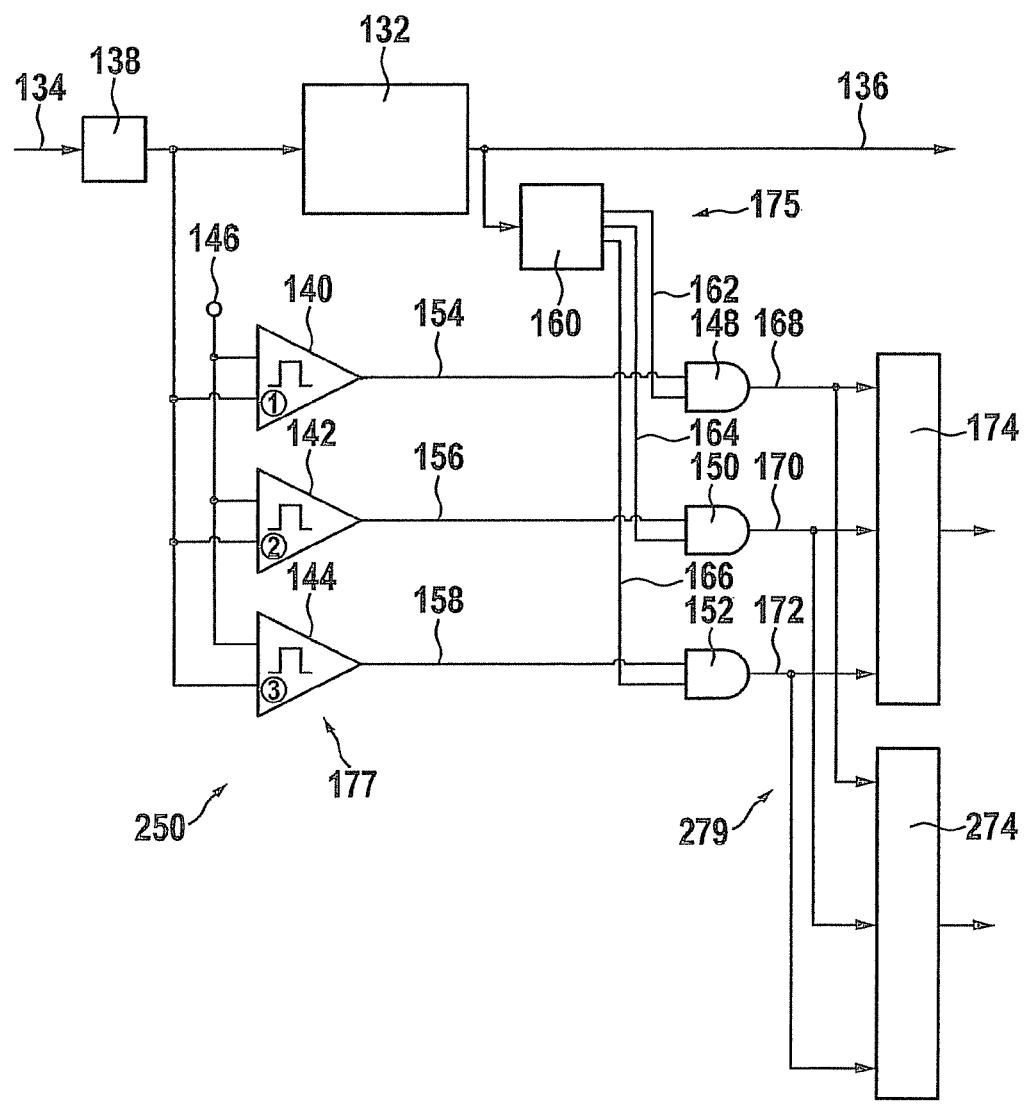
FIG. 6 shows a schematic illustration of a third specific embodiment of a circuit system according to the present invention, which includes the first specific embodiment of the circuit system according to the present invention from FIG. 4, together with three window comparators and an additional self-testing test module.

In the third specific embodiment of a circuit system 250 according to the present invention schematically illustrated in FIG. 6, which includes all components of the first specific embodiment of circuit system 130 according to the present invention from FIG. 4, a second test module 274 is provided in addition to first test module 174. The inputs of second test module 274 are connected to the outputs of AND gates 148, 150, 152, similarly as for the inputs of first test module 174. In the present case, AND gates 148, 150, 152 and the two test modules 174, 274 provided as selection modules form a test circuit system 279. Test modules 174, 274 test one another, and therefore have a self-testing design.

In the error-free case, both error signals e1 and e2, which are provided as output signals of the two test modules 174, 274, are "0." If an error occurs in A/D converter 132 in one of window comparators 140, 142, 144, in selection module 160 (selector), or in an AND gate, both output signals, i.e., error signals, e1, e2 supply a logical "1." If an error occurs in one of the two test modules 174, 274, one of the error signals is "1," while the other error signal is "0." In this manner an error is externally signaled in at least one of test modules 174, 272.

Figure 7:
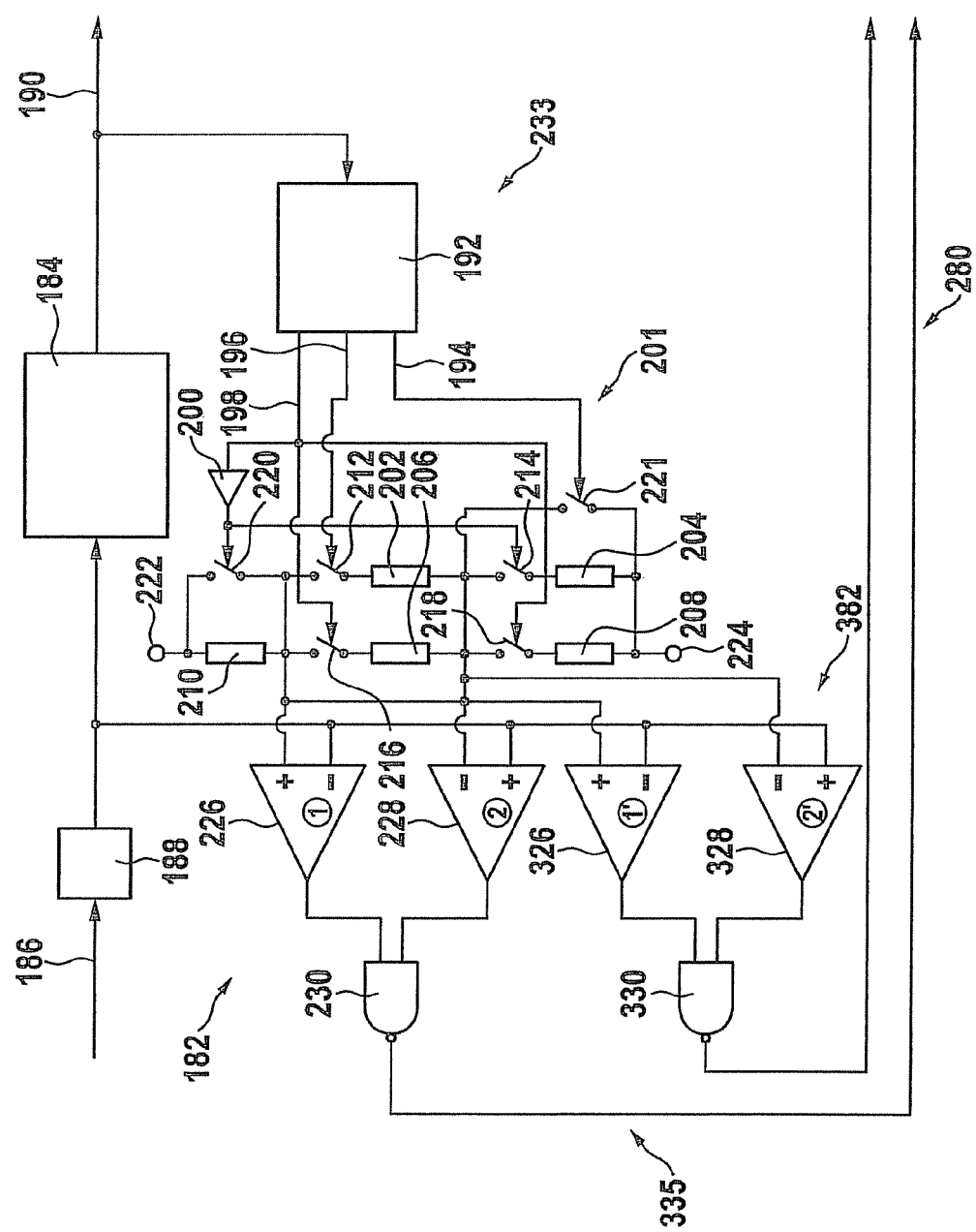
FIG. 7 shows a schematic illustration of a fourth specific embodiment of a circuit system according to the present invention, which includes the second specific embodiment of the circuit system according to the present invention from FIG. 5, and an additional self-testing window comparator.

In circuit system 180 from FIG. 5, operational amplifiers 226, 228 and NAND gate 230, as components of window comparator 182, may have a self-testing design when there are particularly high safety requirements. In this case the redundant design of operational amplifiers 226, 228, 326, 328 and of NAND gate 230, 330, and thus a redundant design of window comparator 182, 382, is provided, as schematically illustrated in the fourth specific example embodiment of circuit system 280 according to the present invention from FIG. 7. This fourth specific embodiment of circuit system 280 includes, in addition to second window comparator 382, the same components as the second specific embodiment of circuit system 180 according to the present invention from FIG. 5. Accordingly, the two window comparators 182, 382, as selection modules, form the components of a second subcircuit system 335, which at the same time corresponds to a test circuit system in the present case.

In the error-free case, both error signals e1 and e2 provided by NAND gates 230, 330 are "0." If an error occurs in A/D converter 184, in window selection module 192 (window selector), or in resistor network 201, both error signals e1, e2 deliver a logical "1." If an error occurs in an operational amplifier 226, 228, 326, 328 or a NAND gate 230, 330, then one of the error signals is "1" and the other error signal is "0."

In one execution of the method according to the present invention, the value range of an A/D converter 132, 184 is subdivided into multiple, usually p, subranges i1, i2, i3. Quantity p of subranges i1, i2, i3 is a function of how many errors are to be detected using circuit system 130, 180, 250, 280 for carrying out the method. In this case, a compromise may be provided between hardware complexity and error coverage, depending on the particular application.

A first subcircuit system 175, 233 evaluates the digital output signal of a converter designed as an A/D converter, and determines in which subrange i1, i2, i3 an instantaneous digital number z, which is provided by the combination of the bits of the digital output signal, is present.

A second, further subcircuit system 177, 335 evaluates analog input signal 134, 186 of a converter designed as an A/D converter 132, 184, and determines in which subrange i1, i2, i3 instantaneous input value $U_{in}$ of analog input signal 134, 186 is present. This second subcircuit system 177, 335 may be implemented either using multiple window comparators 140, 142, 144, each having different voltage limits, as a selection module, or using only one window comparator 182, 382, having variable voltage limits, as a selection module.

A test circuit system 179, 279, which in a first variant includes at least one test module 174, 274, and in a second variant (FIGS. 5 and 7) includes at least one variably adjustable window comparator 182, 382, checks whether instantaneous subranges i1, i2, i3 for input value $U_{in}$ of the analog input signal and for number z, which is formed by a combination of the output values of the digital output signal, correspond to one another. In another embodiment, the at least one test module 174, 274, i.e., the at least one variable window comparator 182, 382, has a self-testing design. In the specific embodiments shown in FIGS. 5 and 7, the test circuit system corresponds to second subcircuit system 177, 235.

The errors which may be present are detected online, i.e., during operation, and thus during the A/D conversion. Permanent and transient errors may be detected in this way.

In circuit systems 130, 180 from FIGS. 4 and 5, in each case an output for an error signal is present which signals an error in the DA conversion. This error signal is either directly supplied to the output of an overall circuit, which includes circuit system 130, 180 shown as well as A/D converter 132, 184, or is combined with other signals to form an error flag, which is then also visible at the output.

The present invention is suitable for all electronic circuits having A/D converters 41, 132, 184, typically for safety-critical applications, such as ASICs, for example, which provide information for functions such as ABS or ESP in the motor vehicle.

What is claimed is:

1. A method for detecting errors of an A/D converter which converts an analog input signal that represents one of a range of input values into a digital output signal that represents one of a range of numbers, the method comprising:
   in a first determination step, determining to which of a plurality of defined analog value subranges that, in combination, spans the range of input values, the input value of the input signal belongs, wherein a respective plurality of possible input values belongs to each of the defined analog value subranges;
   in a second determination step, determining to which of a plurality of defined digital subranges that, in combination, spans the range of numbers, the number which is ascertained by the A/D converter is associated of the output signal belongs, wherein a respective plurality of possible numbers belongs to each of the defined digital subranges and each of the defined digital subranges corresponds to a respective one of the defined analog value subranges;
   in a third determination step, determining whether the subrange, to which the input value of the input signal is determined to belong, corresponds to the subrange to which the number of the output signal is determined to belong; and
   detecting an error when the subrange to which the input value of the input signal is determined to belong and the subrange to which the number of the output signal is determined to belong are determined in the third determination step not to correspond to one another.

2. A method for detecting errors of an A/D converter which converts an analog input signal into a digital output signal, the digital output signal representing a number which results from an input value of the analog input signal when an A/D conversion is carried out, the method comprising:
   subdividing a value range for all possible numbers z into subranges;
   subdividing a value range for all possible input values into subranges;
   associating an input value and a number z corresponding thereto in each case with subranges which correspond to one another;
   determining with which subrange an input value which is to be converted is associated, and with which subrange a number z which is ascertained by the A/D converter is associated; and
   detecting an error when the number z and the input value are associated with subranges which do not correspond to one another;
   wherein a quantity of the subranges is selected to be smaller than a quantity of the numbers z, and a first quantity for higher-value numbers z is combined in an mth subrange and a quantity of low-value numbers z is combined in an m+1th subrange, a quantity of low-value numbers z being one of the same size, larger, and smaller than the first quantity of higher-value numbers z, and an m−1th subrange for input values from which low-value numbers z result being selected to be at least one of the same size, larger, and smaller than an mth subrange for input values from which higher-value numbers z result.

3. A circuit system for detecting errors of an A/D converter which converts an analog input signal into a digital output signal, the digital output signal representing a number z which results from an input value of the analog input signal when an A/D conversion is carried out, the circuit system comprising:
   a first subcircuit system which subdivides a value range for all possible numbers z into subranges;
   a second subcircuit system which subdivides a value range for all possible input values into subranges; and
   at least one test circuit system which associates in each case an input value and a number z corresponding thereto with subranges which correspond to one another;
   wherein the second subcircuit system is configured to determine with which subrange an input value which is to be converted is associated, and the first subcircuit system is configured to determine with which subrange a number z which is ascertained by the A/D converter is associated and the at least one test circuit system is configured to detect an error when the number z and the input value are associated with subranges which do not correspond to one another.

4. The circuit system as recited in claim 3, wherein the first subcircuit system includes at least one selection module which is configured to ascertain with which subrange a number z which is represented by the digital output signal is to be associated, and which is configured to provide an appropriate selection signal, and the second subcircuit system includes at least one selection module which is configured to ascertain with which subrange an input value of the analog input signal is to be associated, and to provide an appropriate selection signal, and the at least one test circuit system has at least one selection module which is configured to compare the selection signals and to detect an error if the selection signals represent different subranges which do not correspond to one another.

5. The circuit system as recited in claim 4, wherein the first subcircuit system has a resistor network which supplies the selection signal to at least one input of the at least one test circuit system.

6. The circuit system as recited in claim 5, wherein the second subcircuit system is a variably adjustable window comparator which associates the input value of the analog input signal with one of subranges.

7. The circuit system as recited in claim 5, wherein the second subcircuit system includes window comparators which associate the input value of the analog input signal with one of subranges.

8. The circuit system as recited in claim 7, wherein the second subcircuit system and the at least one test circuit system have at least one shared component.

9. The circuit system as recited in claim 8, wherein the at least one test circuit system includes at least one redundantly designed, self-testing selection module.

10. The circuit system as recited in claim 9, wherein the test circuit system includes at least one test module.

* * * * *